(12) United States Patent
Sun (10) Patent No.: US 8,669,142 B2
(45) Date of Patent: Mar. 11, 2014

(54) METHOD OF MANUFACTURING PACKAGE STRUCTURE

(71) Applicant: Shih-Hao Sun, Hsinchu County (TW)

(72) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 0 days.

(21) Appl. No.: 13/906,355

(22) Filed: May 31, 2013

(65) Prior Publication Data

US 2013/0260512 A1 Oct. 3, 2013

Related U.S. Application Data

(62) Division of application No. 13/186,448, filed on Jul. 19, 2011, now Pat. No. 8,541,881.

(30) Foreign Application Priority Data

May 20, 2011 (TW) .............................. 100117790 A (51) Int. Cl.
*H01L 21/56* (2006.01)
(52) U.S. Cl.
USPC .................... 438/124; 438/653; 257/E23.011
(58) Field of Classification Search
USPC ........................ 438/124, 653; 257/E23.011
See application file for complete search history.

(56) References Cited

FOREIGN PATENT DOCUMENTS

| JP | 08-023047 | 1/1996 |
|---|---|---|
| JP | 2001110945 | 4/2001 |
| JP | 2001156212 | 6/2001 |
| JP | 2007109914 | 4/2007 |

OTHER PUBLICATIONS

"Office Action of Japan counterpart application" issued on Apr. 23, 2013, p. 1-p. 4.

*Primary Examiner* — Roy Potter
(74) *Attorney, Agent, or Firm* — Jianq Chyun IP Office (57) ABSTRACT

A manufacturing method of a package structure is provided. A seed layer is formed on a upper surface of a metal substrate. A patterned dry film layer is formed on a lower surface of the metal substrate and the seed layer. A portion of the seed layer is exposed by the patterned dry film layer. The patterned dry film layer is used as an electroplating mask to electroplate a circuit layer on the portion of the seed layer exposed by the patterned dry film layer. A chip is bonded to and electrically connected to the circuit layer. A molding compound is formed on the metal substrate. The molding compound encapsulates the chip, the circuit layer and the portion of the seed layer. A portion of the metal substrate and a portion of the seed layer are removed so as to expose a portion of the molding compound.

6 Claims, 5 Drawing Sheets

METHOD OF MANUFACTURING PACKAGE STRUCTURE

CROSS-REFERENCE TO RELATED APPLICATION

This application is a divisional application of and claims the priority benefit of U.S. application Ser. No. 13/186,448, filed on Jul. 19, 2011, now pending, which claims the priority benefit of Taiwan application serial no. 100117790, filed on May 20, 2011. The entirety of each of the above-mentioned patent applications is hereby incorporated by reference herein and made a part of specification.

BACKGROUND OF THE INVENTION

1. Field of the Invention

The invention relates to a package structure and a manufacturing method thereof. More particularly, the invention relates to a package structure having superior heat dissipation and a manufacturing method thereof.

2. Description of Related Art

Chip packaging is performed to protect bare chips, lower the density of chip joints, and provide superior heat dissipation of chips. Conventional packaging methods include installing chips to a package substrate through wire bonding or flip chip bonding, so that the joints on the chips can be electrically connected to the package substrate. Therefore, the joint distribution of the chips can be re-distributed through the package substrate to satisfy the joint distribution of external devices of next hierarchy.

In terms of the conventional light emitting diode (LED) package structure, the LED chips need to be packaged before use and generate a large amount of heat energy when emitting lights. If the heat energy cannot be dissipated and is accumulated in the LED package structure, the temperature of the LED package structure increases continuously. Therefore, overheat may lead to brightness attenuation and shortened lifespan of LED chips or even permanent damage of LED chips under severe circumstances. The LED package structures adopted nowadays have heat sinks disposed therein for heat dissipation of LED chips.

The conventional package substrate is mainly constituted by multiple layers of patterned conductive layer and at least one insulation layer. The insulation layer is disposed between two adjacent patterned conductive layers for insulation. The heat sink is fixed on the lower surface of the package substrate through the adhesive layer. Generally, the LED chips are electrically connected to the package substrate. The heat generated by the LED chips is transferred to the heat sink for heat conduction through the patterned conductive layer and the insulation layer. However, since the adhesive layer and the insulation layer have low heat conductivity, the thermal resistance increases when the heat generated by the LED chips is transferred to the heat sink through the insulation layer and the adhesive layer, so as to result in ineffective heat conduction. Additionally, since the heat sink is adhered to the bottom surface of the package substrate through the adhesive layer, the thickness of the entire package structure cannot be reduced effectively. Thus, designers now focus on transferring the heat energy generated by LED chips to the external environment efficiently and reducing the thickness of the entire package structure in research and development.

SUMMARY OF THE INVENTION

The invention is directed to a package structure having superior heat dissipation.

The invention is directed to a method of manufacturing a package structure to manufacture the package structure aforementioned.

The invention is directed to a method of manufacturing a package structure. A metal substrate is provided. The metal substrate has an upper surface and a lower surface opposite to each other. A seed layer is formed on the upper surface. A patterned dry film layer is formed on the lower surface of the metal substrate and the seed layer. The patterned dry film layer exposes a portion of the seed layer. A circuit layer is electroplated on the portion of the seed layer exposed by the patterned dry film layer using the patterned dry film layer as an electroplating mask. The patterned dry film layer is removed. A chip is bonded to the circuit layer. The chip is connected to the circuit layer. A molding compound is formed of the metal substrate to encapsulate the chip, the circuit layer, and the portion of the seed layer. A portion of the metal substrate and a portion of the seed layer are removed to expose a portion of the molding compound.

In one embodiment of the invention, the method of manufacturing the package structure further includes forming a surface treatment layer on the circuit layer before removing the patterned dry film layer.

In one embodiment of the invention, a method of removing the portion of the metal substrate and the portion of the seed layer includes an etching step.

The invention is further directed to a method of manufacturing a package structure. A metal substrate is provided. A metal substrate has an upper surface and a lower surface opposite to each other and a side surface connecting the upper surface and the lower surface. A seed layer is formed on the upper surface, the lower surface, and the side surface. A patterned dry film layer is formed on the upper surface and the lower surface of the metal substrate. The patterned dry film layer exposes a portion of the seed layer formed on the upper surface of the metal substrate. A circuit layer is electroplated on the portion of the seed layer exposed by the patterned dry film layer using the patterned dry film layer as an electroplating mask. The patterned dry film layer, the metal substrate, and a portion of the seed layer formed on the lower surface and the side surface are removed. An insulation layer and a first metal layer disposed on the insulation layer are laminated on a remaining portion of the seed layer. The insulation layer has a plurality of openings. The circuit layer and the insulation layer, the first metal layer located on the insulation layer are disposed on relative two sides of the remaining portion of the seed layer and arranged interlacingly. The openings expose a portion of the seed layer formed underneath the circuit layer. A second metal layer is formed on the portion of the seed layer exposed by the openings. The second metal layer connects the portion of the seed layer and the first metal layer. A portion of the first metal layer and a portion of the seed layer other than the portion formed underneath the circuit layer to expose a portion of the insulation layer. A chip is bonded to the circuit layer. The chip and the circuit layer are electrically connected. A molding compound is formed to encapsulate the chip and the circuit layer and cover the portion of the insulation layer.

In one embodiment of the invention, the method of manufacturing the package structure further includes: forming a surface treatment layer on the circuit layer before removing the patterned dry film layer, the metal substrate, and the portion of the seed layer formed on the lower surface and the side surface.

In one embodiment of the invention, a step of forming the second metal layer includes: forming a first dry film layer on a first surface of the seed layer, the first dry film layer covering the first surface of the seed layer and the circuit layer; forming a second dry film layer on the first metal layer, the second dry film layer exposing a portion of a second surface of the seed layer opposite to the first surface; electroplating the second metal layer on the portion of the second surface of the seed layer exposed by the second dry film layer using the second dry film layer as an electroplating mask; and removing the first dry film layer and the second dry film layer to expose the circuit layer and the first metal layer.

The invention is directed to a package structure including a metal substrate, a circuit layer, a chip, and a molding compound. The metal substrate has an upper surface and a lower surface opposite to each other and a plurality of openings connecting the upper surface and the lower surface. The circuit layer is disposed on the upper surface of the metal substrate. The chip is disposed on the circuit layer and electrically connected to the circuit layer. The molding compound encapsulates the chip and the circuit layer. A bottom surface of the molding compound substantially aligns with the upper surface of the metal substrate. The openings of the metal substrate expose a portion of the bottom surface of the molding compound.

In one embodiment of the invention, the package structure further includes a surface treatment layer and a seed layer. The surface treatment layer is disposed on the circuit layer. The seed layer is disposed on the upper surface of the metal substrate and sandwiched between the circuit layer and the metal substrate.

The invention is further directed to a package structure including an insulation layer, a circuit layer, a first metal layer, a second metal layer, a chip, and a molding compound. The insulation layer has an upper surface and a lower surface opposite to each other and a plurality of openings connecting the upper surface and the lower surface. The circuit layer is disposed on the top surface of the insulation layer. The circuit layer is arranged on top of the openings correspondingly and exposes a portion of the top surface. The first metal layer is disposed on the bottom surface of the insulation layer and exposes a portion of the top surface and the openings. The second metal layer is disposed in the openings of the insulation layer and connects the circuit layer and the first metal layer. A side of the second metal layer substantially aligns with the top surface of the insulation layer. The chip is disposed on the circuit layer and electrically connected to the circuit layer. The molding compound encapsulates the chip and the circuit layer and covers the portion of the top surface of the insulation layer.

In one embodiment of the invention, the package structure further includes a surface treatment layer and a seed layer. The surface treatment layer is disposed on the circuit layer. The seed layer is disposed among the circuit layer, the second metal layer, and a portion of the insulation layer.

In light of the foregoing, the metal substrate is adopted as a carrier and the circuit layer is formed through plating in the invention. Therefore, when the chip is disposed on the circuit layer, the heat generated by the chip is transferred to the external environment rapidly through the circuit layer and the metal substrate. The package structure of the invention then has superior heat dissipation.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1A:
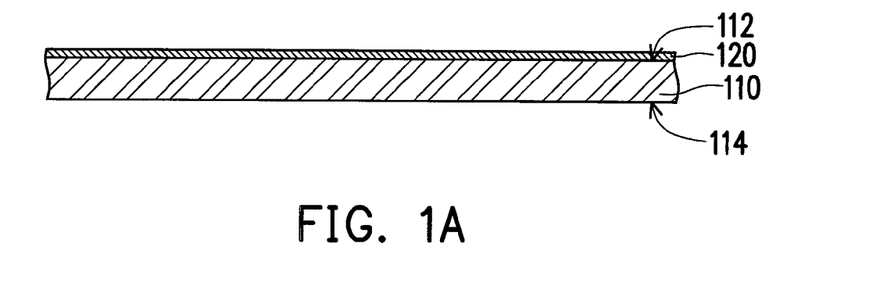
FIGS. 1A to 1E are schematic cross-sectional views of a method of manufacturing a package structure according to an embodiment of the invention.

FIGS. 1A to 1E are schematic cross-sectional views of a method of manufacturing a package structure according to an embodiment of the invention. Referring to FIG. 1A, according to a method of manufacturing a package structure in the present embodiment, a metal substrate 110 is first provided. In details, the metal substrate 110 of the present embodiment has an upper surface 112 and a lower surface 114 opposite to each other. A seed layer 120 is formed on the upper surface 112. A material of the metal substrate 110 includes a metal with high conductivity, for example, copper or aluminum, and an alloy, for example, a copper alloy or an aluminum alloy. However, the invention is not limited thereto. The seed layer 120 is, for example, a chemical copper layer electroplated on the upper surface 112 of the metal substrate 110 through a plating process.

Figure 1B:
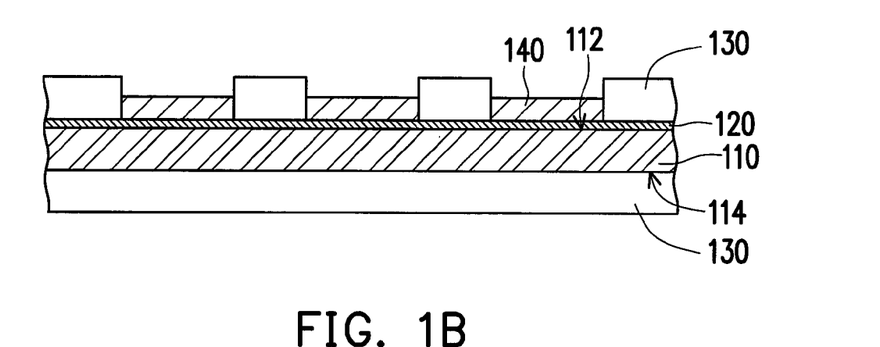

Referring to FIG. 1B, a patterned dry film layer 130 is formed on the lower surface 114 of the metal substrate 110 and the seed layer 120. The patterned dry film layer 130 exposes a portion of the seed layer 120 and covers the lower surface 114 of the metal substrate 110 completely. Next, a circuit layer 140 is electroplated on the portion of the seed layer 120 exposed by the patterned dry film layer 130 using the patterned dry film layer 130 as an electroplating mask. Particularly, the line width and the thickness of the circuit layer 140 can be adjusted through the patterned dry film layer 130 in the present embodiment. Here, the line width of the circuit layer 140 is, for instance, shorter than 30 μm. Thus, comparing to the conventional circuit layer having the conventional line width, the circuit layer 140 of the present embodiment can be deemed as a microfine circuit layer.

Figure 1C:
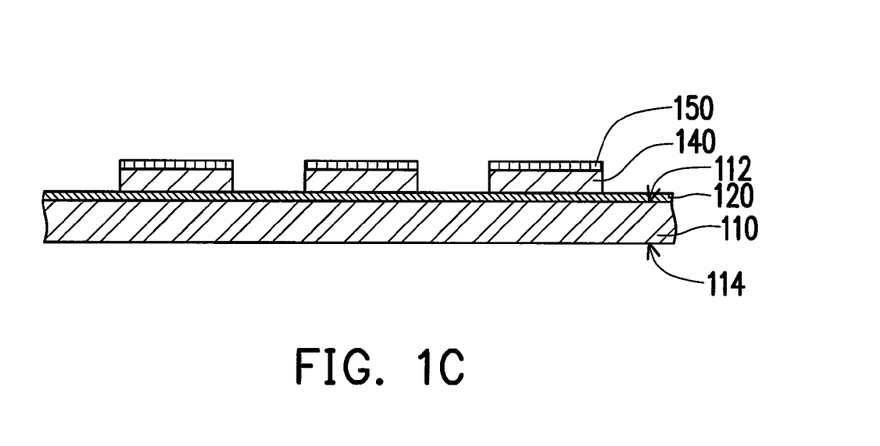

Referring to FIGS. 1B and 1C, a surface treatment layer 150 is formed on the circuit layer 140. A method of forming the surface treatment layer 150 includes the following. For example, the surface treatment layer 150 is electroplated on the circuit layer 140 by utilizing the patterned dry film layer 130 as an electroplating mask. The surface treatment layer 150 is, for example, a nickel layer, a gold layer, a silver layer, a nickel-palladium-gold layer or other suitable material layers, and the invention is not limited thereto. Referring to FIG. 1C, the patterned dry film layer 130 is removed to expose a portion of the seed layer 120 disposed on the upper surface 112 of the metal substrate 110 and the lower surface 114.

Figure 1D:
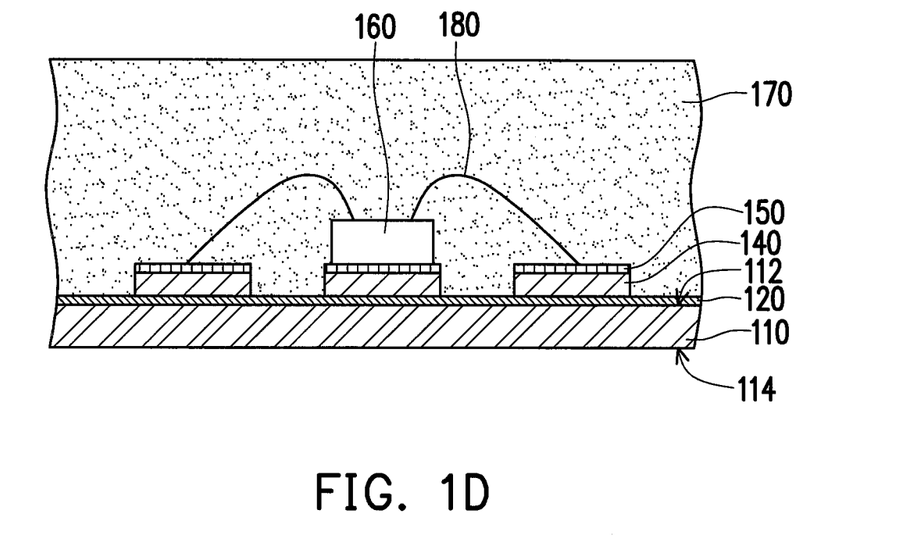

Referring to FIG. 1D, a chip 160 is bonded to the surface treatment layer 150 formed on the circuit layer 140. The chip 160 is electrically connected to the surface treatment layer 150 on the circuit layer 140 via a plurality of solder wires 180. A molding compound 170 is then formed on the metal substrate 110. The molding compound 170 encapsulates the chip 160, the solder wires 180, the surface treatment layer 150, the circuit layer 140, and the portion of the seed layer 120.

Figure 1E:
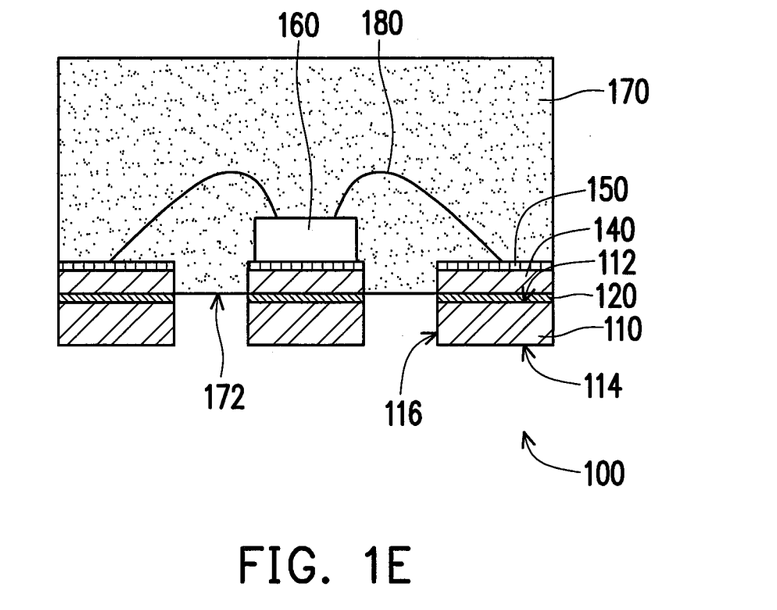

Referring to FIG. 1E, a portion of the metal substrate 110 and a portion of the seed layer 120 are removed to expose a portion of the molding compound 170. A method of removing the portion of the metal substrate 110 and the portion of the seed layer 120 is an etching step, for example. Herein, the manufacture of a package structure 100 is completed.

In terms of structure, referring to FIG. 1E, the package structure 100 in the present embodiment includes the metal substrate 110, the seed layer 120, the circuit layer 140, the surface treatment layer 150, the chip 160, the molding compound 170, and the solder wires 180. The metal substrate 110 has the upper surface 112 and the lower surface 114 opposite to each other and a plurality of openings 116 connecting the upper surface 112 and the lower surface 114. The seed layer 120 is disposed on the upper surface 112 of the metal substrate 110. The circuit layer 140 is disposed on the upper surface 112 of the metal substrate 110. The seed layer 120 is sandwiched between the circuit layer 140 and the metal substrate 110. The surface treatment layer 150 is disposed on the circuit layer 140. The chip 160 is disposed on the surface treatment layer 150 on the circuit layer 140. The chip 160 is electrically connected to the surface treatment layer 150 formed on the circuit layer 140 via the solder wires 180. The molding compound 170 encapsulates the chip 160 and the circuit layer 140. A bottom surface 172 of the molding compound 170 substantially aligns with the upper surface 112 of the metal substrate 110. The openings 116 of the metal substrate 110 expose a portion of the bottom surface 172 of the molding compound 170.

In the present embodiment, the metal substrate 110 is adopted as a carrier and the circuit layer 140 is formed through a plating process. Thus, when the chip 160 is disposed on the surface treatment layer 150 on the circuit layer 140, the heat generated by the chip 160 can be transferred to the external environment rapidly through the surface treatment layer 150, the circuit layer 140, and the metal substrate 110. The package structure 100 of the present embodiment thus has superior heat dissipation. Additionally, since the line width and the thickness of the circuit layer 140 can be adjusted through the patterned dry film layer 130 in the present embodiment, the microfine circuit layer required can therefore be manufactured.

It should be noted that the invention does not limit the type of bonding between the chip 160 and the surface treatment layer 150 disposed on the circuit layer 140. Specifically, the chip 160 herein is electrically connected to the surface treatment layer 150 above the circuit layer 140 through wire bonding. However, the chip 160 can also be electrically connected to the surface treatment layer 150 above the circuit layer 140 through flip chip bonding in other embodiments. Accordingly, the type of bonding between the chip 160 and the circuit layer 140 aforementioned is merely for illustration and not used to limit the invention.

Figure 2A:
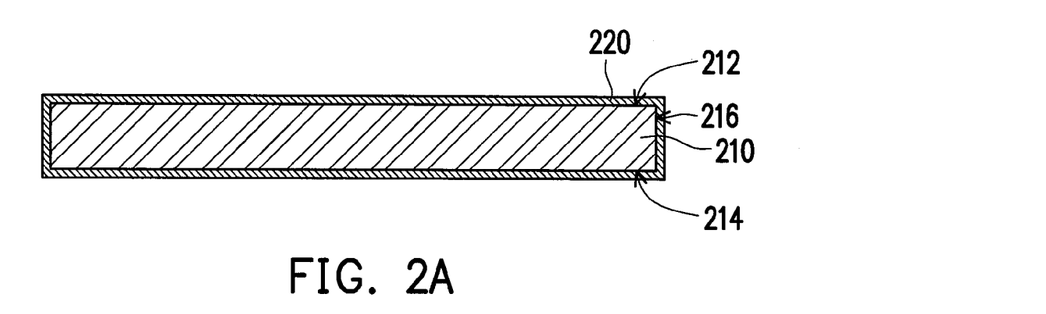
FIGS. 2A to 2I are schematic cross-sectional views of a method of manufacturing a package structure according to another embodiment of the invention.

FIGS. 2A to 2I are schematic cross-sectional views of a method of manufacturing a package structure according to another embodiment of the invention. Referring to FIG. 2A, according to a method of manufacturing a package structure in the present embodiment, a metal substrate 210 is first provided. In details, a metal substrate 210 has an upper surface 212 and a lower surface 214 opposite to each other and a side surface 216 connecting the upper surface 212 and the lower surface 214. A seed layer 220 is formed on the upper surface 212, the lower surface 214, and the side surface 216. A material of the metal substrate 210 includes a metal with high conductivity, for example, copper or aluminum, and an alloy, for example, a copper alloy or an aluminum alloy. However, the invention is not limited thereto. The seed layer 220 is, for example, a chemical copper layer electroplated on the upper surface 212, the lower surface 214, and the side surface 216 of the metal substrate 210 through a plating process.

Figure 2B:
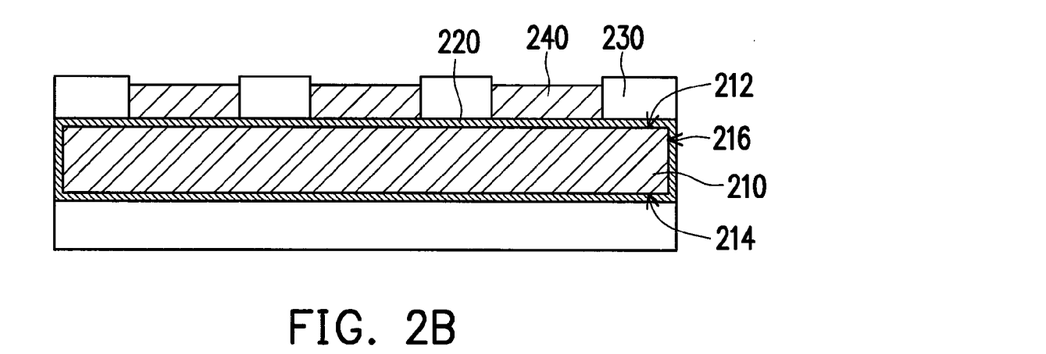

Referring to FIG. 2B, a patterned dry film layer 230 is formed on the upper surface 212 and the lower surface 214 of the metal substrate 210. The patterned dry film layer 230 exposes a portion of the seed layer 220 formed on the upper surface 212 of the metal substrate 210. Next, a circuit layer 240 is electroplated on the portion of the seed layer 220 exposed by the patterned dry film layer 230 using the patterned dry film layer 230 as an electroplating mask. Particularly, the line width and the thickness of the circuit layer 240 can be adjusted through the patterned dry film layer 230 in the present embodiment. Here, the line width of the circuit layer 240 is, for instance, shorter than 30 μm. Thus, comparing to the conventional circuit layer having the conventional line width, the circuit layer 240 of the present embodiment can be deemed as a microfine circuit layer.

Figure 2C:
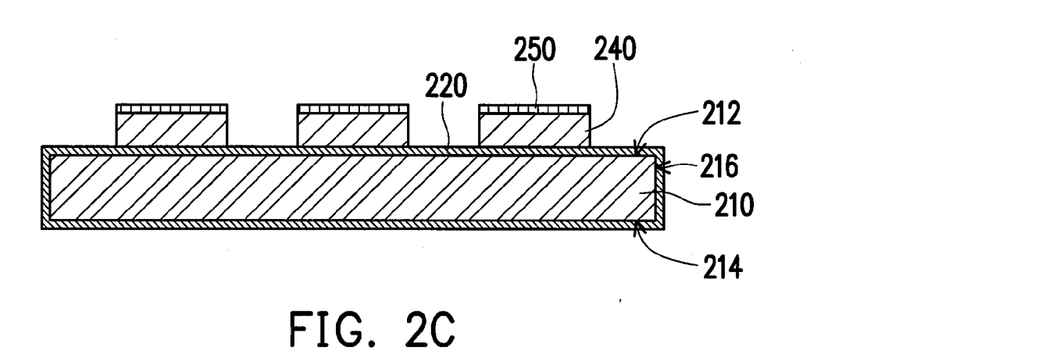

Referring to FIGS. 2B and 2C simultaneously, a surface treatment layer 250 is formed on the circuit layer 240. A method of forming the surface treatment layer 250 includes the following. For example, the surface treatment layer 250 is electroplated on the circuit layer 240 by utilizing the patterned dry film layer 230 as an electroplating mask. The surface treatment layer 250 is, for example, a nickel layer, a gold layer, a silver layer, a nickel-palladium-gold layer or other suitable material layers, and the invention is not limited thereto.

Figure 2D:
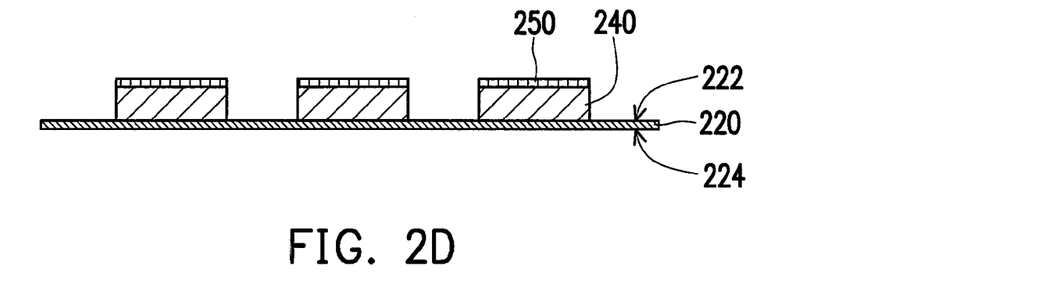

Referring to FIGS. 2C and 2D simultaneously, the patterned dry film layer 230, the metal substrate 210, and a portion of the seed layer 220 formed on the lower surface 214 and the side surface 216 of the metal substrate 210. Here, a remaining portion of the seed layer 220 has a first surface 222 and a second surface 224 opposite to each other. The circuit layer 240 and the surface treatment layer 250 stacked on the circuit layer 240 are located on the first surface 222 of the seed layer 220.

Figure 2E:
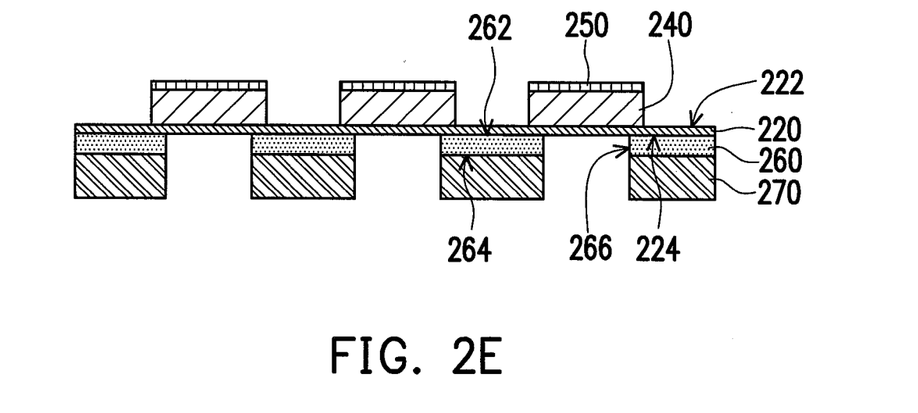

Referring to FIG. 2E, an insulation layer 260 and a first metal layer 270 disposed on the insulation layer 260 are laminated on the remaining portion of the seed layer 220. The insulation layer 260 and the first metal layer 270 thereon are disposed on the second surface 224 of the seed layer 220. The insulation layer 260 has a top surface 262 and a bottom surface 264 opposite to each other and a plurality of openings 266. In details, the circuit layer 240 and the insulation layer 260, the first metal layer 270 on the insulation layer 260 are disposed on relative two sides of the remaining portion of the seed layer 220 and arranged interlacingly. The top surface 262 of the insulation layer 260 connects to the second surface 224 of the seed layer 220. The openings 266 expose a portion of the seed layer 220 located underneath the circuit layer 240. That is, the openings 266 expose a portion of the second surface 224 of the seed layer 220. In the present embodiment, the first metal layer 270 is disposed on the bottom surface 264 of the insulation layer 260. The insulation layer 260 and the first metal layer 270 are arranged conformally. A method of forming the openings 266 is a mechanical drilling method or a laser drilling method, for instance.

Figure 2F:
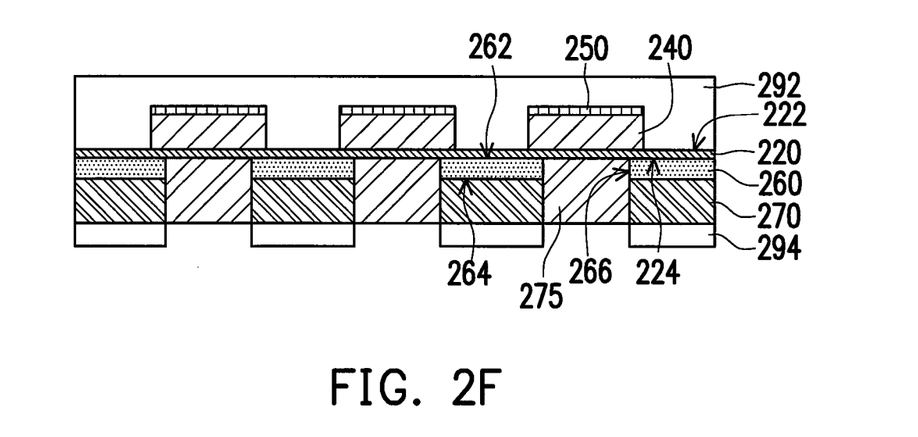

Next, referring to FIG. 2F, a first dry film layer 292 is formed on the first surface 222 of the seed layer 220 and a second dry film layer 294 is formed on the first metal layer 270. Herein, the first dry film layer 292 covers the first surface 222 of the seed layer 220 and the circuit layer 240, and the second dry film layer 294 exposes the portion of the second surface 224 of the seed layer 220. A second metal layer 275 is then electroplated on the portion of the second surface 224 of the seed layer 220 exposed by the second dry film layer 294 while using the second dry film layer 294 as an electroplating mask. The second metal layer 275 connects the portion of the second surface 224 of the seed layer 220 and the first metal layer 270. Further, a material of the second metal layer 275 includes a metal with high conductivity such as a single metal, for example, copper, aluminum, silver or gold, or an alloy, for example, a copper alloy or an aluminum alloy. However, the invention is not limited thereto.

Figure 2G:
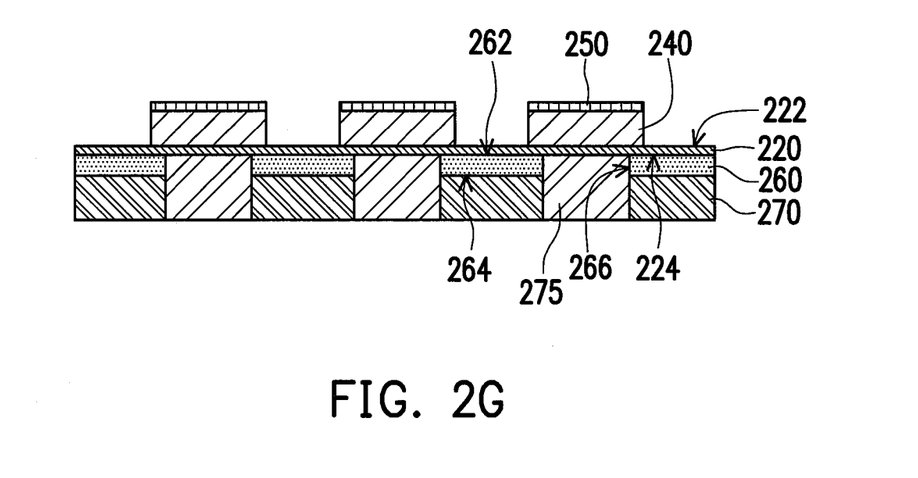

Referring to FIG. 2G, the first dry film layer 292 and the second dry film layer 294 are removed to expose the circuit layer 240, the surface treatment layer 250, and the first metal layer 270.

Figure 2H:
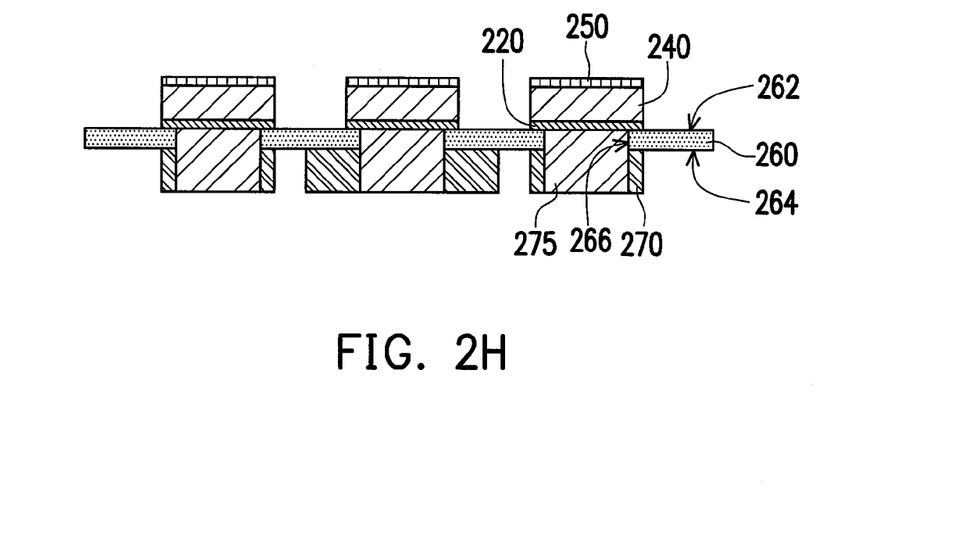

Referring to FIG. 2H, a portion of the first metal layer 270 and a portion of the seed layer 220 other than the portion underneath the circuit layer 240 are removed to expose a portion of the top surface 262 and a portion of the bottom surface 264 of the insulation layer 260.

Figure 2I:
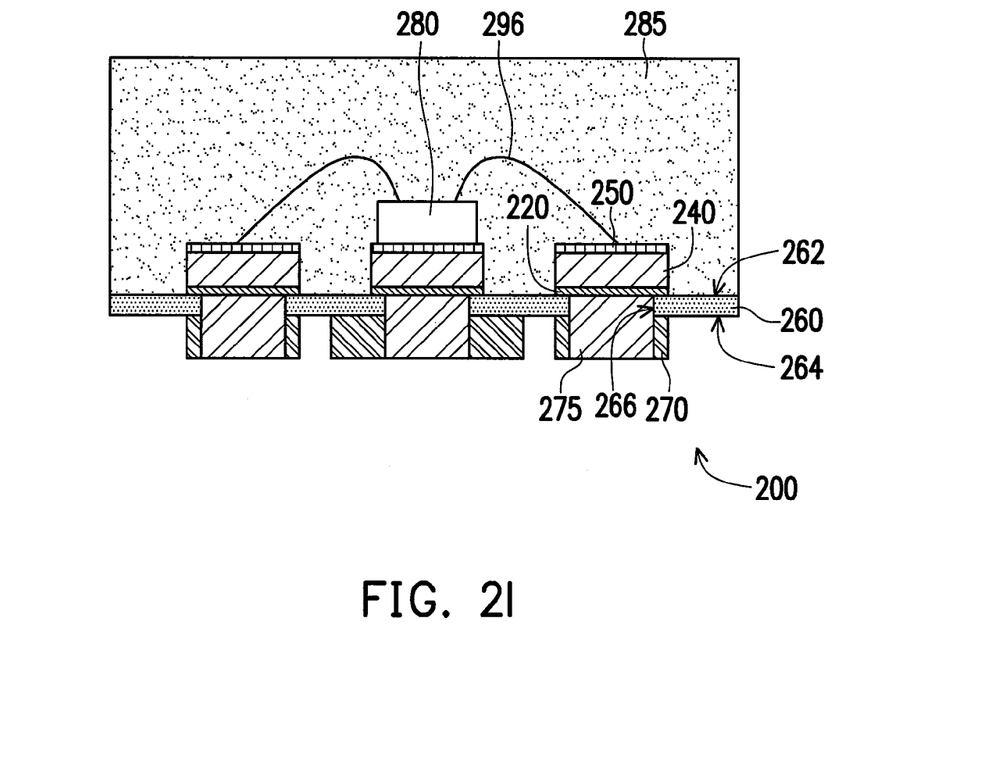

Referring to FIG. 2I, a chip 280 is bonded to the surface treatment layer 250 formed on the circuit layer 240. The chip 280 is electrically connected to the circuit layer 240 via a plurality of solder wires 296. Later, a molding compound 285 is formed to encapsulate the chip 280, the solder wires 296, the surface treatment layer 250, and the circuit layer 240 and cover the portion of the top surface 262 of the insulation layer 260. Herein, the manufacture of a package structure 200 is completed.

In terms of structure, referring to FIG. 2I, the package structure 200 in the present embodiment includes the seed layer 220, the circuit layer 240, the surface treatment layer 250, the insulation layer 260, the first metal layer 270, the second metal layer 275, the chip 280, the molding compound 285, and the solder wires 296. The insulation layer 260 has the upper surface 262 and the bottom surface 264 opposite to each other and the openings 266 connecting the upper surface 262 and the bottom surface 264. The circuit layer 240 is disposed on the top surface 262 of the insulation layer 260. The circuit layer 240 is arranged on top of the openings 266 correspondingly and exposes a portion of the top surface 262. The surface treatment layer 250 is disposed on the circuit layer 240. The first metal layer 270 is disposed on the bottom surface 264 of the insulation layer 260 and exposes the openings 266. The second metal layer 275 is disposed in the openings 266 of the insulation layer 260, and connects the circuit layer 240 and the first metal layer 270. A side of the second metal layer 275 substantially aligns with the top surface 262 of the insulation layer 260. The seed layer 220 is disposed among the circuit layer 240, the second metal layer 275, and a portion of the insulation layer 260. The chip 280 is disposed on the circuit layer 240 and electrically connected to the circuit layer 240 via the solder wires 296. The molding compound 285 encapsulates the chip 280, the surface treatment layer 250, and the circuit layer 240 and covers a portion of the upper surface 262 of the insulation layer 260.

In the present embodiment, the metal substrate 210 is adopted as a carrier and the circuit layer 240 is formed through a plating process. The metal substrate 210 and a portion of the seed layer 220 are removed after the surface treatment layer 250 is formed. Accordingly, the package structure 200 of the present embodiment does not include a carrier and thus has a thinner package thickness. Furthermore, the chip 280 is disposed on the surface treatment layer 250 on the circuit layer 240, and the second metal layer 275 connects the circuit layer 240 and the first metal layer 270. The heat generated by the chip 280 can therefore be transferred to the external environment rapidly through the surface treatment layer 250, the circuit layer 240, the seed layer 220, the second metal layer 275, and the first metal layer 270. The package structure 200 of the present embodiment thus has superior heat dissipation. In addition, the line width and the thickness of the circuit layer 240 can be adjusted through the patterned dry film layer 230 in the present embodiment to manufacture the microfine circuit layer required.

It should be noted that the invention does not limit the type of bonding between the chip 280 and the surface treatment layer 250 disposed on the circuit layer 240. Specifically, the chip 280 herein is electrically connected to the surface treatment layer 250 above the circuit layer 240 through wire bonding. Nonetheless, the chip 280 can also be electrically connected to the surface treatment layer 250 above the circuit layer 240 through flip chip bonding in other embodiments. Accordingly, the type of bonding between the chip 280 and the circuit layer 240 aforementioned is merely for illustration and not used to limit the invention.

In summary, the metal substrate is adopted as a carrier and the circuit layer is formed through plating in the invention. Therefore, when the chip is disposed on the circuit layer, the heat generated by the chip is transferred to the external environment rapidly through the circuit layer and the metal substrate. The package structure of the invention then has superior heat dissipation. On the other hand, the metal substrate can be removed after the surface treatment layer is formed. Moreover, a package structure with better heat dissipation can be formed by laminating the insulation layer and the first metal layer and then electroplating the second metal layer. Hence, since the package structure of the present embodiment does not include a carrier and thus has a thinner package thickness, and the heat generated by the chip can be transferred to the external environment rapidly through the surface treatment layer, the circuit layer, the second metal layer, and the first metal layer, the package structure of the invention can have superior heat dissipation. Additionally, the line width and the thickness of the circuit layer can be adjusted through the patterned dry film layer in the invention to manufacture the microfine circuit layer required.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A method of manufacturing a package structure, comprising:
    providing a metal substrate having an upper surface and a lower surface opposite to each other, the upper surface having a seed layer formed thereon;
    forming a patterned dry film layer on the lower surface of the metal substrate and the seed layer, wherein the patterned dry film layer exposes a portion of the seed layer;
    plating a circuit layer on the portion of the seed layer exposed by the patterned dry film layer by using the patterned dry film layer as an electroplating mask;
    removing the patterned dry film layer;
    bonding a chip to the circuit layer, wherein the chip is connected to the circuit layer;
    forming a molding compound on the metal substrate, the molding compound encapsulating the chip, the circuit layer, and the portion of the seed layer; and
    removing a portion of the metal substrate and a portion of the seed layer to expose a portion of the molding compound.

2. The method of manufacturing the package structure as claimed in claim 1, further comprising:
    forming a surface treatment layer on the circuit layer before removing the patterned dry film layer.

3. The method of manufacturing the package structure as claimed in claim 1, wherein a method of removing the portion of the metal substrate and the portion of the seed layer comprises an etching step.

4. A method of manufacturing a package structure, comprising:
- providing a metal substrate having an upper surface and a lower surface opposite to each other and a side surface connecting the upper surface and the lower surface, wherein a seed layer is formed on the upper surface, the lower surface, and the side surface;
- forming a patterned dry film layer on the upper surface and the lower surface of the metal substrate, wherein the patterned dry film layer exposes a portion of the seed layer formed on the upper surface of the metal substrate;
- plating a circuit layer on the portion of the seed layer exposed by the patterned dry film layer by using the patterned dry film layer as an electroplating mask;
- removing the patterned dry film layer, the metal substrate, and a portion of the seed layer formed on the lower surface and the side surface;
- laminating an insulation layer and a first metal layer disposed on the insulation layer on a remaining portion of the seed layer, wherein the insulation layer has a plurality of openings, and the circuit layer and the insulation layer, the first metal layer disposed on the insulation layer are disposed on relative two sides of the remaining portion of the seed layer and arranged interlacingly, and the openings expose a portion of the seed layer formed underneath the circuit layer;
- forming a second metal layer on the portion of the seed layer exposed by the openings, wherein the second metal layer connects the portion of the seed layer and the first metal layer;
- removing a portion of the first metal layer and a portion of the seed layer other than the portion formed underneath the circuit layer to expose a portion of the insulation layer;
- bonding a chip to the circuit layer, wherein the chip and the circuit layer are electrically connected; and
- forming a molding compound to encapsulate the chip and the circuit layer and cover the portion of the insulation layer.

5. The method of manufacturing the package structure as claimed in claim 4, the method further comprising:
- forming a surface treatment layer on the circuit layer before removing the patterned dry film layer, the metal substrate, and the portion of the seed layer formed on the lower surface and the side surface.

6. The method of manufacturing the package substrate as claimed in claim 4, wherein a step of forming the second metal layer comprises:
- forming a first dry film layer on a first surface of the seed layer, the first dry film layer covering the first surface of the seed layer and the circuit layer;
- forming a second dry film layer on the first metal layer, the second dry film layer exposing a portion of a second surface of the seed layer opposite to the first surface;
- plating the second metal layer on the portion of the second surface of the seed layer exposed by the second dry film layer by using the second dry film layer as an electroplating mask; and
- removing the first dry film layer and the second dry film layer to expose the circuit layer and the first metal layer.

\* \* \* \* \*